US012635311B2

(12) United States Patent
Hsieh et al.

(10) Patent No.: US 12,635,311 B2
(45) Date of Patent: May 19, 2026

(54) ELECTRONIC DEVICE AND MANUFACTURING METHOD THEREOF

(71) Applicant: Innolux Corporation, Miaoli County (TW)

(72) Inventors: Tsau-Hua Hsieh, Miaoli County (TW); Yi-An Chen, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 723 days.

(21) Appl. No.: 17/987,726

(22) Filed: Nov. 15, 2022

(65) Prior Publication Data

US 2023/0187586 A1     Jun. 15, 2023

(30) Foreign Application Priority Data

Dec. 15, 2021     (CN) .......................... 202111533330.3

(51) Int. Cl.
*H10H 20/85* (2025.01)
*H10H 20/01* (2025.01)
*H10H 20/851* (2025.01)
*H10H 20/855* (2025.01)
*H10H 20/857* (2025.01)

(52) U.S. Cl.
CPC ...... *H10H 20/8506* (2025.01); *H10H 20/851* (2025.01); *H10H 20/855* (2025.01); *H10H 20/857* (2025.01); *H10H 20/0361* (2025.01); *H10H 20/0363* (2025.01); *H10H 20/0364* (2025.01)

(58) Field of Classification Search
CPC ............. H10H 20/8506; H10H 20/851; H10H 20/855; H10H 20/857; H10H 20/0361; H10H 20/0363; H10H 20/0364; H10H 20/8514; H01L 25/0753
See application file for complete search history.

(56) References Cited

U.S. PATENT DOCUMENTS

| 2020/0008669 | A1 |  | 1/2020 | De Vries et al. |  |
|---|---|---|---|---|---|
| 2020/0185453 | A1 |  | 6/2020 | Cho et al. |  |
| 2021/0351237 | A1 | * | 11/2021 | Tsai | H10K 59/352 |
| 2022/0085334 | A1 | * | 3/2022 | Oh | H10K 59/38 |

(Continued)

FOREIGN PATENT DOCUMENTS

| CN | 107833903 | 3/2018 |
|---|---|---|
| CN | 111540754 | 8/2020 |
| CN | 112530988 | 3/2021 |

(Continued)

OTHER PUBLICATIONS

"Office Action of Taiwan Counterpart Application", issued on May 11, 2023, p. 1-p. 8.

(Continued)

*Primary Examiner* — Jonathan Han
(74) *Attorney, Agent, or Firm* — JCIPRNET

(57) ABSTRACT

An electronic device and a manufacturing method thereof are disclosed. The electronic device includes a substrate, an electronic element, a barrier layer, a light absorbing layer, and a filter layer. The electronic element is disposed on the substrate. The barrier layer is disposed on the substrate and surrounds a side surface of the electronic element. The light absorbing layer is disposed on the barrier layer. The filter layer is disposed on the electronic element.

20 Claims, 3 Drawing Sheets

(56)                    References Cited

U.S. PATENT DOCUMENTS

2022/0310976 A1*   9/2022   Lee ..................... H10K 59/877
2023/0335689 A1*   10/2023  Kim ..................... H10D 86/00

FOREIGN PATENT DOCUMENTS

CN          113241360        8/2021
CN          113451489        9/2021

OTHER PUBLICATIONS

"Office Action of Taiwan Counterpart Application", issued on Apr. 22, 2024, p. 1-p. 4.
"Office Action of China Counterpart Application", issued on Jan. 30, 2026, p. 1-p. 8.

* cited by examiner

ELECTRONIC DEVICE AND MANUFACTURING METHOD THEREOF

CROSS-REFERENCE TO RELATED APPLICATION

This application claims the priority benefit of Chinese application no. 202111533330.3, filed on Dec. 15, 2021. The entirety of the above-mentioned patent application is hereby incorporated by reference herein and made a part of this specification.

BACKGROUND

Technical Field

The disclosure relates to an electronic device and a manufacturing method thereof. In particular, the disclosure relates to an electronic device which increases light efficiency or increases ambient contrast and a manufacturing method thereof.

Description of Related Art

Electronic devices or tiled electronic devices have been widely applied to different fields such as communication, display, vehicle, aviation, or the like. The vigorous progressing electronic devices are developed toward lightweighting and thinning. Therefore, requirements for the reliability or quality of the electronic devices are increasing.

SUMMARY

The disclosure provides an electronic device which increases light efficiency or increases ambient contrast and a manufacturing method thereof.

According to an embodiment of the disclosure, an electronic device includes a substrate, an electronic element, a barrier layer, a light absorbing layer, and a filter layer. The electronic element is disposed on the substrate. The barrier layer is disposed on the substrate and surrounds aside surface of the electronic element. The light absorbing layer is disposed on the barrier layer. The filter layer is disposed on the electronic element.

According to an embodiment of the disclosure, a manufacturing method of an electronic device includes the following. A substrate is provided. An electronic element is disposed on the substrate. A barrier layer is formed on the substrate so as to surround a side surface of the electronic element. A light absorbing layer is formed on the barrier layer. A filter layer is formed on the electronic element.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
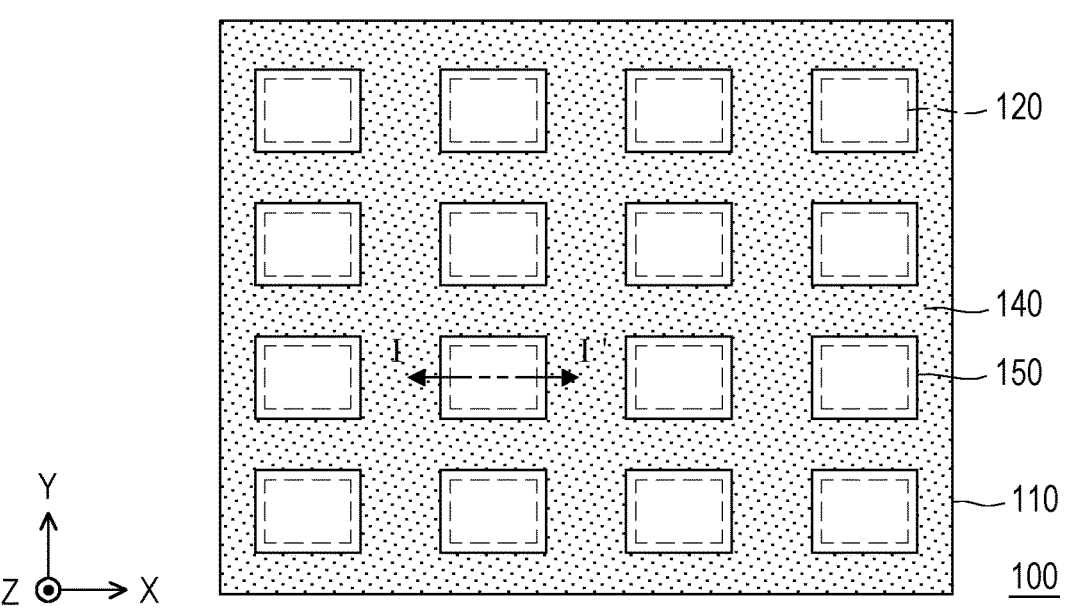
FIG. 1A is a schematic partial top view of an electronic device according to an embodiment of the disclosure.

The disclosure may be understood with reference to the following detailed description together with the accompanying drawings. It should be noted that, for ease of understanding by readers and conciseness of the drawings, a plurality of drawings in the disclosure merely show a part of an electronic device, and specific elements in the drawings are not drawn to scale. In addition, the number and size of elements in the drawings only serve for exemplifying instead of limiting the scope of the disclosure.

In the following description and claims, terms such as "include", "comprise", and "have" are open-ended terms, and thus should be interpreted as "including, but not limited to".

It should be understood that when a element or film layer is referred to as being "on", or "connected to" another element or film layer, the element or film layer may be directly on or connected to the another element or film layer, or intervening elements or film layers may also be present in between (non-direct circumstances). In contrast, when a element or film layer is referred to as being "directly on" or "directly connected to" another element or film layer, no intervening elements or film layers are present in between.

Although terms such as "first", "second", "third", etc. may be used to describe diverse constituent elements, such constituent elements are not limited by the terms. The terms are used only to discriminate one constituent element from other constituent elements in the specification. Instead of using the same terms in the claims, the terms first, second, third, etc. may be used in accordance with the order of claiming a element. Accordingly, in the following description, a first constituent element may be a second constituent element in the claims.

Herein, the term "about", "approximately", "substantially", or "essentially" typically represents that a value is within 10%, 5%, 3%, 2%, 10%, or 0.5% of a given value or range. Herein, the given value is an approximate value, namely implicitly meaning "about," "approximately", "substantially", or "essentially" without specifically describing the terms "about," "approximately", "substantially", or "essentially".

In some embodiments of the disclosure, terms related to bonding and connection such as "connection", "interconnection", etc., unless specifically defined, may indicate the case where two structures are in direct contact, or where two structures are not in direct contact and other structures are disposed in between. Moreover, such terms related to bonding and connection may also cover the case where two structures are both movable or where two structures are both fixed. In addition, the term "couple" includes any direct and indirect electrical connection means.

In some embodiments of the disclosure, an optical microscopy (OM), a scanning electron microscope (SEM), a thin film thickness profiler (α-step), an ellipsometer, or other suitable manner may be used to measure an area, a width, a thickness, or a height of each element or measure a distance or a spacing between elements. To be specific, according to some embodiments, a SEM may be used to obtain a cross-sectional structural image including a element to be measured, and measure an area, a width, a thickness, or a height of each element or measure a distance or a spacing between elements.

In the disclosure, the electronic device may include, for example but not limited to, a display device, a packaging device, a semiconductor packaging device, a backlight device, an antenna device, a sensing device, or a tiled device. The electronic device may include a bendable or flexible electronic device. The display device may include a non-self-luminous display device or a self-luminous display device. The antenna device may be a liquid crystal mode antenna or a non-liquid crystal mode antenna. The sensing device may include, for example but not limited to, a sensing device for sensing capacitance, light, thermal energy, or ultrasonic waves. An electronic element may include passive elements or active elements, such as a capacitor, a resistor, an inductor, a diode, a transistor, or the like. The diode may include, for example but not limited to, a light-emitting diode (LED) or a photodiode. The light-emitting diode may include an organic light-emitting diode (OLED), an inorganic LED, a mini LED, a micro LED, or a quantum dot LED. A tiled device may include, for example but not limited to, a tiled display device or a tiled antenna device. It should be noted that the electronic device may be any arrangement or combination of the above, but is not limited thereto. Hereinafter, an electronic device will be taken to describe the disclosure, but the disclosure is not limited thereto.

It should be understood that the features in several different embodiments below may be replaced, recombined, or mixed with each other to form other embodiments without departing from the spirit of the disclosure. The features in the embodiments may be arbitrarily used in mixture or combination without departing from the spirit of the disclosure or conflicting with each other.

Reference will now be made in detail to the exemplary embodiments of the disclosure, examples of which are illustrated in the accompanying drawings. Wherever possible, the same reference numerals are used in the drawings and description to refer to the same or like parts.

Figure 1B:
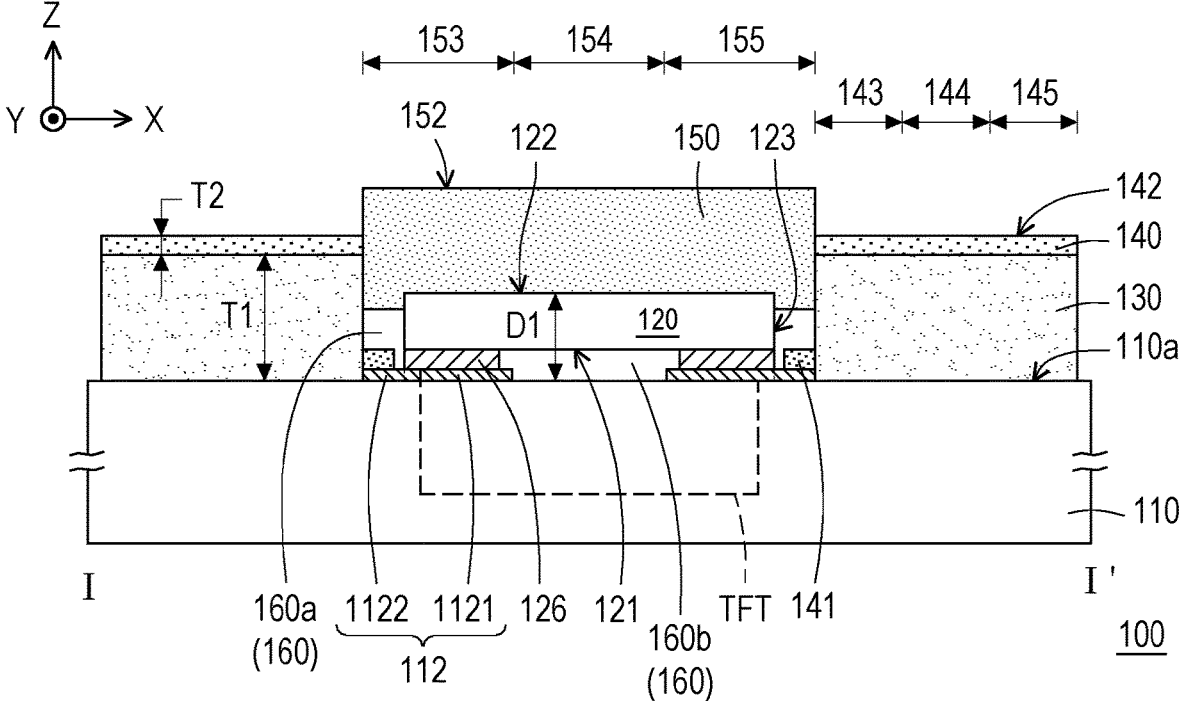
FIG. 1B is a schematic cross-sectional view of the electronic device of FIG. 1A along section line I-I'.

FIG. 1A is a schematic partial top view of an electronic device according to an embodiment of the disclosure. FIG. 1B is a schematic cross-sectional view of the electronic device of FIG. 1A along section line I-I'. FIG. 1A omits illustration of several elements, for example but not limited to, barrier 130 in an electronic device 100.

With reference to FIG. 1A and FIG. 1B, the electronic device 100 of this embodiment includes a substrate 110, an electronic element 120, a barrier layer 130, a light absorbing layer 140, and a filter layer 150. The electronic element 120 may be disposed on the substrate 110. The barrier layer 130 may be disposed on the substrate 110 and may surround a side surface 123 of the electronic element 120. The light absorbing layer 140 may be disposed on the barrier layer 130. The filter layer 150 may be disposed on the electronic element 120.

The substrate 110 may include a substrate body and a circuit layer on the substrate body. For example, the substrate 110 may include the substrate body, a driving element (not shown), and a bonding pad 112, but not limited thereto. The driving element and the bonding pad 112 may be disposed on a surface of the substrate body, and the bonding pad 112 may be electrically connected to the driving element. For example, the driving element may include a thin film transistor TFT.

In this embodiment, the substrate body may include a rigid substrate, a flexible substrate, or a combination thereof. For example, the material of the substrate 110 may include glass, quartz, sapphire, a silicon wafer, a silicon carbide wafer, ceramics, polycarbonate (PC), polymethyl methacrylate, silicone, polyimide (PI), polyethylene terephthalate (PET), other suitable substrate materials, or a combination thereof, but not limited thereto.

In this embodiment, a direction X, a direction Y, and a direction Z are different directions. The direction X is an extension direction of section line I-I', for example. The direction Z is a normal direction of the substrate 110, for example. The direction X is substantially perpendicular to the direction Z, and the direction X and the direction Z are substantially perpendicular to direction Y, but not limited thereto.

The electronic element 120 may be disposed on a surface 110a of the substrate 110. According to some embodiments, the electronic element 120 may be disposed on the bonding pad 112 of the substrate 110, and the electronic element 120 may be electrically connected to the bonding pad 112. The electronic element 120 has a first surface 121, a second surface 122, and the side surface 123. The first surface 121 faces the substrate 110. The first surface 121 and the second surface 122 are opposite to each other. The side surface 123 connects the first surface 121 and the second surface 122. The electronic element 120 may include a conductive element 126. In this embodiment, the electronic element 120 may be electrically connected to the bonding pad 112 through the conductive element 126. The conductive element 126 is disposed on the first surface 121 of the electronic element 120 and is disposed between the electronic element 120 and the bonding pad 112. The conductive element 126 may be an electrode, a solder ball, or an anisotropic conductive film (ACF) of the electronic element 120, but not limited thereto. In this embodiment, the electronic element 120 may be a light-emitting diode. For example, the electronic element 120 may be a red light-emitting diode, a green light-emitting diode, or a blue light-emitting diode, but not limited thereto.

In this embodiment, a distance D1 is between the second surface 122 of the electronic element 120 and the surface 110a of the substrate 110. The distance D1 may be a distance between the second surface 122 of the electronic element 120 and the surface 110a of the substrate 110 measured along the normal direction of the substrate 110 (the direction Z). The distance D1 is 3 micrometers ($\mu$m) to 5 $\mu$m, for example but not limited thereto. In addition, in this embodiment, the electronic element 120 may overlap a portion 1121 of the bonding pad 112 and expose another portion 1122 of the bonding pad 112 in the normal direction of the substrate 110 (the direction Z).

The barrier layer 130 is disposed on the surface 110a of the substrate 110. The barrier layer 130 may surround the side surface 123 of the electronic element 120 to increase the light efficiency or increase the color gamut of the electronic element 120. A gap is between the barrier layer 130 and the side surface 123 of the electronic element 120. In this embodiment, the barrier layer 130 has a thickness T1. The thickness T1 may be a thickness of the barrier layer 130 measured along the normal direction of the substrate 110 (the direction Z). The thickness T1 may be greater than or equal to the distance D1, for example but not limited thereto. The thickness T1 may be 1 $\mu$m to 25 $\mu$m, for example but not limited thereto. The thickness T1 of the barrier layer 130 may be, for example, 3 μm to 15 μm, and may be, for example, 5 μm to 10 μm. The thickness T1 of the barrier layer 130 may be adjusted depending on a thickness of the electronic element 120. According to some embodiments, the electronic element 120 may be a light-emitting element, and the thickness T1 of the barrier layer 130 may be greater than the thickness of the electronic element 120. As such, the barrier layer 130 may shield the lateral leakage light of the electronic element 120. In addition, in this embodiment, the barrier layer 130 may be a single-layer structure or a multi-layer structure. When the barrier layer 130 is a single-layer structure, the material of the barrier layer 130 may include a white photoresist or a gray photoresist. When the barrier layer 130 is a multi-layer structure, the material of the barrier layer 130 may include a stacked layer of transparent photoresists and metal layers. According to some embodiments, the barrier layer 130 may be a pixel defining layer.

The light absorbing layer 140 is disposed on a surface of the barrier layer 130 away from the substrate 110 to reduce the ambient light reflection and increase the ambient contrast. According to some embodiments, the substrate 110 includes the bonding pad 112, the electronic element 120 is electrically connected to the bonding pad 112, and a portion 141 of the light absorbing layer 140 may be disposed on the bonding pad 112. For example, the portion 141 of the light absorbing layer 140 may be disposed on the another portion 1122 of the bonding pad 112 and cover the another portion 1122 of the bonding pad 112 to further reduce the ambient light reflection. The light absorbing layer 140 may be in contact with the barrier layer 130. In addition, in this embodiment, the light absorbing layer 140 has a thickness T2. The thickness T2 may be a thickness of the light absorbing layer 140 measured along the normal direction of the substrate 110 (the direction Z). The thickness T2 may be 0.1 μm to 5 μm, for example but not limited thereto. The thickness T2 of the light absorbing layer 140 may be, for example, 0.3 μm to 3 μm, and may be, for example, 0.5 μm to 2 μm. In this embodiment, since the thickness T2 of the light absorbing layer 140 may be 0.5 μm to 2 μm, this can prevent the case where the light absorbing layer 140 cannot be easily formed through a photolithography process due to an excessive thickness, or the light absorbing layer 140 affects the light efficiency of the electronic element 120 due to an excessive thickness.

As shown in FIG. 1B, in this embodiment, the light absorbing layer 140 is formed through a photolithography process. As such, the light absorbing layer 140 may include a flat surface. For example, a surface 142 of the light absorbing layer 140 away from the barrier layer 130 may include a flat surface. Specifically, the light absorbing layer 140 may be equally divided into three equal parts in the direction X, namely, a left equal part 143, a middle equal part 144, and a right equal part 145. The flat surface of the light absorbing layer 140 may be located on at least the surface 142 corresponding to the middle equal part 144. According to some embodiments, the light absorbing layer 140 may include a light absorbing material and a resin. The light absorbing material may include a color material, such as a black material, a gray material, a dark material, or a combination thereof. The light absorbing material in the light absorbing layer 140 may include color pastes, carbon black, titanium black, and dye black. In addition, in this embodiment, the light absorbing layer 140 may be in a matrix shape, and may be a black matrix (BM) or a gray matrix, for example. According to some embodiments, the light absorbing layer 140 may be a color photoresist.

The electronic device 100 of this embodiment may further include a filler layer 160. The filler layer 160 may be disposed between the electronic element 120 and the barrier layer 130, and may be disposed between the electronic element 120 and the substrate 110. Specifically, the filler layer 160 may be disposed in a gap between the electronic element 120 and the barrier layer 130, and may be disposed in a gap between the electronic element 120 and the substrate 110 to fix the electronic element 120.

To be specific, as shown in FIG. 1B, a portion 160a of the filler layer 160 may be disposed in the gap between the electronic element 120 and the barrier layer 130, and another portion 160b of the filler layer 160 may be disposed in the gap between the electronic element 120 and the substrate 110 to fix the electronic element 120. In addition, in this embodiment, the filler layer 160 may be a die attached paste, for example but not limited thereto.

With reference to FIG. 1B, the filter layer 150 may be disposed on the second surface 122 of the electronic element 120. A portion 151 of the filter layer 150 may be disposed on the filler layer 160. The filter layer 150 may be surrounded by the barrier layer 130. The filter layer 150 may be in contact with the second surface 122 and part of the side surface 123 of the electronic element 120 to limit passage of light of a specific wavelength to reduce the ambient light reflection of the electronic element 120. In this embodiment, since the filter layer 150 is formed through a photolithography process, a surface 152 of the filter layer 150 away from the electronic element 120 may include a flat surface. Specifically, the filter layer 150 may be equally divided into three equal parts in the direction X, namely, a left equal part 153, a middle equal part 154, and a right equal part 155. The flat surface of the filter layer 150 may be located on at least the surface 152 corresponding to the middle equal part 154. In addition, in this embodiment, the filter layer 150 may be a color photoresist, for example but not limited to, a red filter layer, a green filter layer, or a blue filter layer.

In this embodiment, a manufacturing method of the electronic device 100 may include the following, for example but not limited thereto. The substrate 110 is provided. The electronic element 120 is disposed on the substrate 110. The barrier layer 130 is formed on the substrate 110 so as to surround the side surface 123 of the electronic element 120. The light absorbing layer 140 is formed on the barrier layer 130. The filter layer 150 is formed on the electronic element 120.

To be specific, according to some embodiments, the manufacturing method of the electronic device 100 may include the following, for example but not limited thereto. First, the substrate 110 is provided. Next, the electronic element 120 is disposed on the substrate 110. Next, the barrier layer 130 is formed on the substrate 110 so as to surround the side surface 123 of the electronic element 120. Next, the light absorbing layer 140 is formed on the barrier layer 130. Next, the filler layer 160 is formed between the electronic element 120 and the substrate 110, and the filler layer 160 is formed between the electronic element 120 and the barrier layer 130. Next, the filter layer 150 is formed on the electronic element 120.

According to some embodiments, the substrate 110 may include the bonding pad 112, and the method of the disclosure further includes disposing the portion 141 of the light absorbing layer 140 on the bonding pad 112. According to some embodiments, the method of the disclosure further includes forming the filler layer 160 between the electronic element 120 and the substrate 110, and forming the filler layer 160 between the electronic element 120 and the barrier layer 130. According to some embodiments, the method of the disclosure further includes forming a portion of the filter layer 150 on the filler layer 160. According to some embodiments, the method of the disclosure further includes forming a light conversion layer 170 between the electronic element 120 and the filter layer 150.

Figure 2:
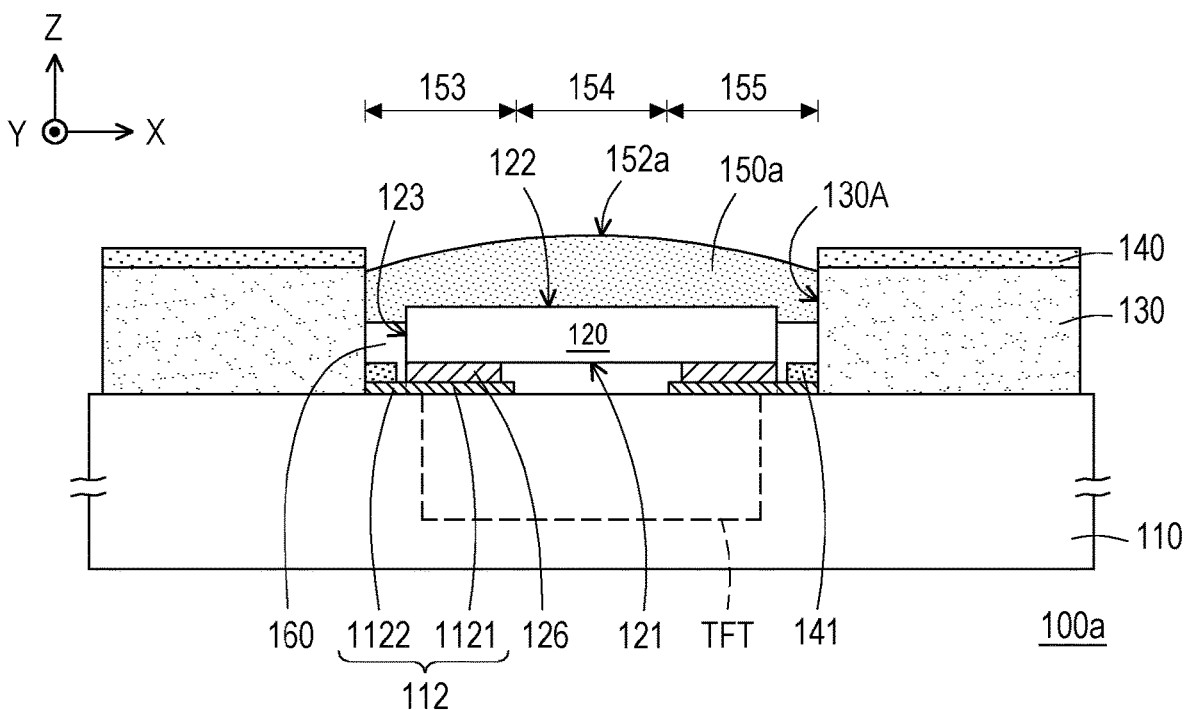
FIG. 2 is a schematic partial cross-sectional view of an electronic device according to another embodiment of the disclosure.
Figure 3:
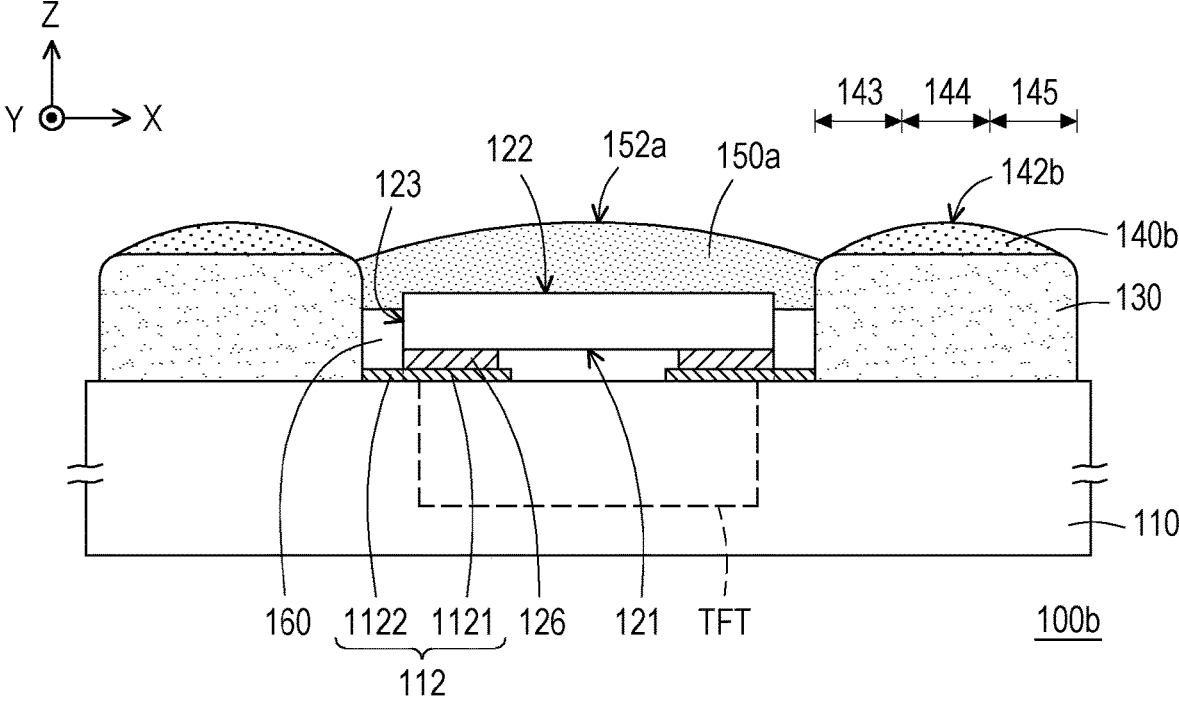
FIG. 3 is a schematic partial cross-sectional view of an electronic device according to another embodiment of the disclosure.
Figure 4:
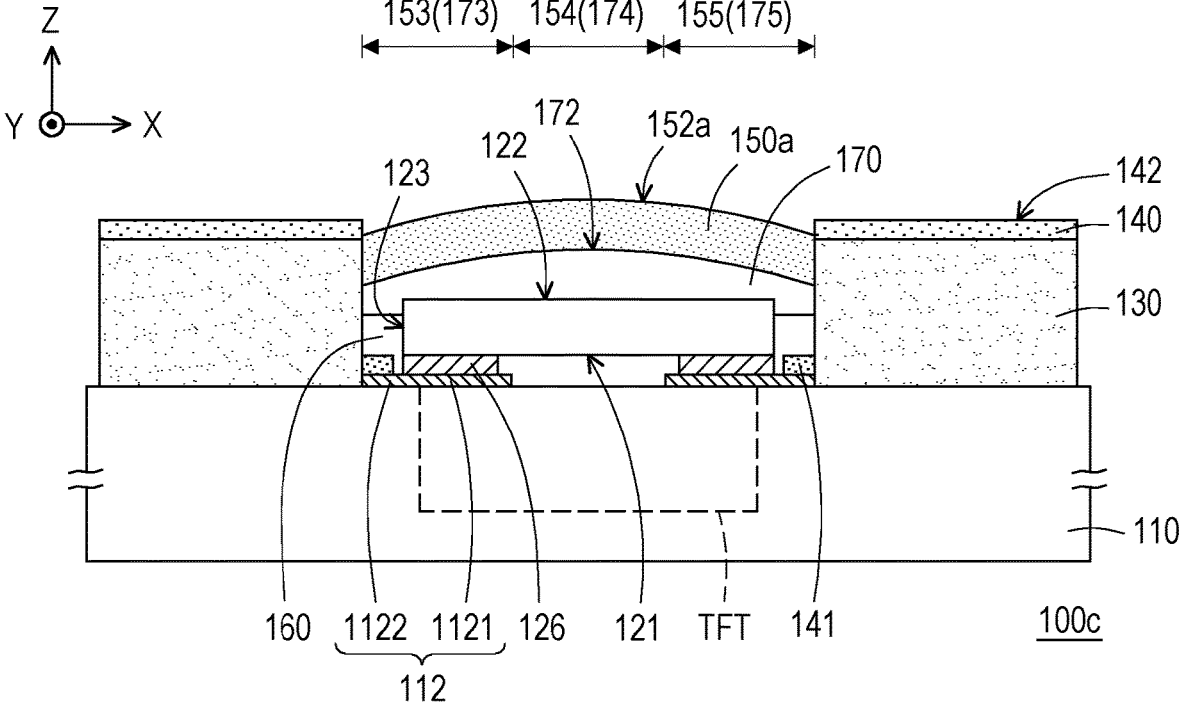
FIG. 4 is a schematic partial cross-sectional view of an electronic device according to another embodiment of the disclosure.

As shown in FIG. 1B, in this embodiment, forming the light absorbing layer 140 may precede forming the filter layer 150, but not limited thereto. In some embodiments, since each of the light absorbing layer 140 and the filter layer 150 are formed through a photolithography process, forming the light absorbing layer 140 may also follow forming the filter layer 150. In addition, in some embodiments, the light absorbing layer 140 may also be formed through a printing process, for example, formed through an inkjet printing process (as shown in FIG. 3). The filter layer 150 may also be formed through a printing process, for example, formed through an inkjet printing process (as shown in FIG. 2 to FIG. 4). So far, the electronic device 100 of this embodiment is substantially completed. In addition, according to some embodiments, forming the light conversion layer 170 may precede forming the filter layer 150.

Other embodiments will be provided below for description. It should be noted here that the reference numerals and part of the content of the embodiments above remain to be used in the following embodiments, where the same reference numerals are adopted to refer to the same or similar elements, and the description of the same technical content is omitted. Reference may be made to the embodiments above for the description of the omitted part, which will not be repeated in the following embodiments.

FIG. 2 is a schematic partial cross-sectional view of an electronic device according to another embodiment of the disclosure. With reference to FIG. 1B and FIG. 2 together, an electronic device 100a of this embodiment is similar to the electronic device 100 of FIG. 1B, while the difference between them lies in that, in the electronic device 100a of the present embodiment, a filter layer 150a may include a curved surface 152a.

Specifically, with reference to FIG. 2, in this embodiment, the filter layer 150a is formed through an inkjet printing process. As such, the filter layer 150a may include the curved surface 152a. For example, as shown in FIG. 2, the surface of the filter layer 150a may include the curved surface 152a. The curved surface 152a of the filter layer 150a may be located on at least the surface corresponding to the middle equal part 154 of the filter layer 150a. In addition, the curved surface 152a of the filter layer 150a shown in FIG. 2 may be a protruding curved surface, but not limited thereto. In some embodiments, the curved surface of the filter layer may also be a recessed curved surface (not shown). According to some embodiments, to be specific, the curved surface 152a of the filter layer 150a may be a protruding surface. For example, the middle equal part 154 of the filter layer 150a has a protruding surface protruding in a direction away from the substrate 110. Through the protruding surface of the filter layer 150a, the angle of emitted light can be increased, and the viewing angle of the electronic device 100a can be increased.

In addition, in this embodiment, the light absorbing layer 140 and the filter layer 150a are formed in different manufacturing methods. The light absorbing layer 140 is formed through a photolithography process, and the filter layer 150a is formed through a printing process. Therefore, forming the light absorbing layer 140 (i.e., a photolithography process)

may precede forming the filter layer 150a (i.e., a printing process). According to some embodiments, as shown in FIG. 2, the electronic element 120 may be disposed on the substrate 110 after the barrier layer 130 and the light absorbing layer 140 are formed. Specifically, after the barrier layer 130 and the light absorbing layer 140 are formed through a photolithography process and an opening 130A of the barrier layer 130 is formed, the electronic element 120 is disposed in the opening 130A. Next, the filter layer 150a is formed through an inkjet printing process.

FIG. 3 is a schematic partial cross-sectional view of an electronic device according to another embodiment of the disclosure. With reference to FIG. 2 and FIG. 3 together, an electronic device 100b of this embodiment is similar to the electronic device 100a of FIG. 2, while the difference between them lies in that, in the electronic device 100b of this embodiment, a light absorbing layer 140b may include a curved surface 142b, and the light absorbing layer 140b does not cover the bonding pad 112.

Specifically, with reference to FIG. 3, in this embodiment, the light absorbing layer 140b is formed through a printing process. As such, the light absorbing layer 140b may include the curved surface 142b and the light absorbing layer 140b is not disposed on the another portion 1122 of the bonding pad 112. The curved surface 142b of the light absorbing layer 140b may be located on at least the surface corresponding to the middle equal part 144 of the light absorbing layer 140b. In addition, the curved surface 142b of the light absorbing layer 140b shown in FIG. 3 may be a protruding curved surface, but not limited thereto. In some embodiments, the curved surface of the light absorbing layer may also be a recessed curved surface (not shown). According to some embodiments, the filter layer 150 may include the curved surface 152a. For example, the curved surface 152a may be located on at least the surface corresponding to the middle equal part 154.

In addition, in this embodiment, since each of the light absorbing layer 140b and the filter layer 150a are formed through a printing process, forming the light absorbing layer 140b may precede or follow forming the filter layer 150a.

FIG. 4 is a schematic partial cross-sectional view of an electronic device according to another embodiment of the disclosure. With reference to FIG. 2 and FIG. 4 together, an electronic device 100c of this embodiment is similar to the electronic device 100a of FIG. 2, while the difference between them lies in that the electronic device 100c of this embodiment further includes the light conversion layer 170.

Specifically, with reference to FIG. 4, the light conversion layer 170 may be disposed between the electronic element 120 and the filter layer 150a. For example, the light conversion layer 170 may be disposed between the second surface 122 of the electronic element 120 and the filter layer 150a. The light conversion layer 170 may be surrounded by the barrier layer 130. The light conversion layer 170 may be in contact with the second surface 122 and part of the side surface 123 of the electronic element 120.

As shown in FIG. 4, in this embodiment, since the light conversion layer 170 is formed through a printing process, a surface 172 of the light conversion layer 170 away from the electronic element 120 may include a curved surface. Specifically, the light conversion layer 170 may be equally divided into three equal parts in the direction X, namely, a left equal part 173, a middle equal part 174, and a right equal part 175. The curved surface of the light conversion layer 170 may be located on at least the surface 172 corresponding to the middle equal part 174. In addition, in this embodiment, the material of the light conversion layer 170 may include a quantum dot (QD), fluorescence, phosphor, or a combination thereof, but not limited thereto. For example, when the electronic element 120 is a blue light-emitting diode, the light conversion layer 170 may be a red quantum dot (or a green quantum dot), and the filter layer 150*a* may be a red filter layer (or a green filter layer). Accordingly, the electronic device 100*c* can emit red light (or green light). As shown in FIG. 4, according to some embodiments, the filter layer 150 may include the curved surface 152*a*. For example, the curved surface 152*a* may be located on at least the surface corresponding to the middle equal part 154.

In this embodiment, since the light conversion layer 170 is located between the second surface 122 of the electronic element 120 and the filter layer 150*a*, forming the light conversion layer 170 should precede forming the filter layer 150*a*. In addition, when forming the filter layer 150*a* follows forming the light conversion layer 170 and the material of the light conversion layer 170 is a quantum dot sensitive to high temperature, the filter layer 150*a* should have a property of being curable at a low temperature of 150° C. or below.

In addition, in this embodiment, the light absorbing layer 140 and the light conversion layer 170 are formed in different manufacturing methods. The light absorbing layer 140 is formed through a photolithography process, and the light conversion layer 170 is formed through a printing process. Therefore, forming the light absorbing layer 140 (i.e., a photolithography process) should precede forming the light conversion layer 170 (i.e., a printing process).

In addition, in some embodiments, the light absorbing layer 140 may also be formed through a printing process, and the filter layer 150*a* may also be formed through a photolithography process.

In summary of the foregoing, in the electronic device and the manufacturing method thereof according to the embodiments of the disclosure, since the barrier layer may surround the side surface of the electronic element, the light efficiency and/or the color gamut of the electronic element can be increased. According to some embodiments, since the light absorbing layer may be disposed on the surface of the barrier layer away from the substrate, it is possible to reduce the ambient light reflection and increase the ambient contrast. According to some embodiments, the filter layer may be disposed on the second surface of the electronic element to thus limit passage of light of a specific wavelength, so as to reduce the ambient light reflection of the electronic element.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
a substrate comprising a substrate body, a driving element and a bonding pad, wherein the bonding pad is electrically connected to the driving element;
an electronic element disposed on the substrate and electrically connected to the bonding pad;
a barrier layer disposed on the substrate and surrounding the electronic element;
a light absorbing layer disposed on the barrier layer and comprising a first portion and a second portion separated from each other, wherein the first portion of the light absorbing layer is disposed on the barrier layer, and the second portion of the light absorbing layer is disposed on the bonding pad; and
a filter layer disposed on the electronic element.

2. The electronic device according to claim 1, wherein the electronic element is a light-emitting diode.

3. The electronic device according to claim 1, further comprising:
a light conversion layer disposed between the electronic element and the filter layer.

4. The electronic device according to claim 1, wherein the filter layer comprises a curved surface.

5. The electronic device according to claim 4, wherein the light absorbing layer comprises a flat surface.

6. The electronic device according to claim 1, wherein the light absorbing layer comprises a curved surface.

7. The electronic device according to claim 1, wherein a thickness of the light absorbing layer is 0.1 micrometer to 5 micrometers.

8. The electronic device according to claim 1, wherein a top surface of the second portion of the light absorbing layer is lower than a top surface of the electronic element.

9. The electronic device according to claim 1, wherein the electronic element has a first surface, a second surface and a side surface, the first surface faces the substrate, the first surface and the second surface are opposite to each other, and the side surface connects the first surface and the second surface,
wherein there is a gap between a side surface of the barrier layer and the side surface of the electronic element,
wherein the second portion of the light absorbing layer is disposed in the gap.

10. The electronic device according to claim 9, further comprising:
a filler layer disposed on the substrate, wherein at least a portion of the filler layer is disposed in the gap and on the second portion of the light absorbing layer.

11. The electronic device according to claim 10, wherein the barrier layer surrounds the filter layer, and a portion of the filter layer is disposed on the at least portion of the filler layer and in the gap.

12. A manufacturing method of an electronic device, the method comprising:
providing a substrate, wherein the substrate comprising a substrate body, a driving element and a bonding pad, and the bonding pad is electrically connected to the driving element;
disposing an electronic element on the substrate, wherein the electronic element is electrically connected to the bonding pad;
forming a barrier layer on the substrate, such that the barrier layer surrounds the electronic element;
forming a light absorbing layer, wherein the light absorbing layer comprises a first portion and a second portion separated from each other, the first portion of the light absorbing layer is disposed on the barrier layer, and the second portion of the light absorbing layer is disposed on the bonding pad; and
forming a filter layer on the electronic element.

13. The manufacturing method according to claim 12, wherein the electronic element has a first surface, a second surface and a side surface, the first surface faces the substrate, the first surface and the second surface are opposite to each other, and the side surface connects the first surface and the second surface,
wherein the manufacturing method further comprises:
forming a gap between a side surface of the barrier layer and the side surface of the electronic element, forming the second portion of the light absorbing layer in the gap.

14. The manufacturing method according to claim 13, further comprising:

forming a portion of the filter layer on the filler layer.

15. The manufacturing method according to claim 12, wherein forming the light absorbing layer precedes forming the filter layer.

16. The manufacturing method according to claim 12, further comprising:

forming a light conversion layer between the electronic element and the filter layer.

17. The manufacturing method according to claim 16, wherein forming the light conversion layer precedes forming the filter layer.

18. The manufacturing method according to claim 12, wherein each of the light absorbing layer and the filter layer are formed through a photolithography process.

19. The manufacturing method according to claim 12, wherein each of the light absorbing layer and the filter layer are formed through a printing process.

20. The manufacturing method according to claim 12, wherein the light absorbing layer is formed through a photolithography process, and the filter layer is formed through a printing process.

* * * * *